(12) United States Patent
Deng et al.

(10) Patent No.: US 10,943,977 B2
(45) Date of Patent: Mar. 9, 2021

(54) GAA FET WITH U-SHAPED CHANNEL

(71) Applicant: Taiwan Semiconductor Manufacturing Co., Ltd., Hsinchu (TW)

(72) Inventors: Jie-Cheng Deng, New Taipei (TW); Yi-Jen Chen, Hsinchu (TW); Chia-Yang Liao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/710,352

(22) Filed: Dec. 11, 2019

(65) Prior Publication Data
US 2020/0111873 A1 Apr. 9, 2020

Related U.S. Application Data

(62) Division of application No. 15/628,243, filed on Jun. 20, 2017, now Pat. No. 10,510,840.

(51) Int. Cl.
*H01L 29/10* (2006.01)
*H01L 29/423* (2006.01)
*H01L 29/51* (2006.01)
*H01L 29/66* (2006.01)
*H01L 29/49* (2006.01)
*H01L 29/06* (2006.01)
*H01L 29/775* (2006.01)
(Continued)

(52) U.S. Cl.
CPC .......... *H01L 29/1037* (2013.01); *B82Y 10/00* (2013.01); *H01L 29/0673* (2013.01); *H01L 29/1033* (2013.01); *H01L 29/42376* (2013.01); *H01L 29/42392* (2013.01); *H01L 29/495* (2013.01); *H01L 29/4916* (2013.01); *H01L 29/4966* (2013.01); *H01L 29/517* (2013.01); *H01L 29/66439* (2013.01); *H01L 29/66742* (2013.01); *H01L 29/775* (2013.01); *H01L 29/78696* (2013.01)

(58) Field of Classification Search
CPC ............. H01L 29/1037; H01L 29/0673; H01L 29/66439; H01L 29/775; H01L 29/42376; H01L 29/1033; H01L 29/78696; H01L 29/42392; H01L 29/517; H01L 29/66742; H01L 29/495; H01L 29/4966; H01L 29/4916; H01L 29/42356; H01L 29/66795; H01L 29/785; B82Y 10/00
See application file for complete search history.

(56) References Cited

U.S. PATENT DOCUMENTS 9,209,247 B2   12/2015   Colinge et al.
9,236,267 B2   1/2016   De et al.
(Continued)

OTHER PUBLICATIONS

C.J. Su et al., "Gate-All-Around Junctionless Transistors with Heavily Doped Polysilicon Nanowire Channels" IEEE Electron Device Letters, Apr. 2011, 32(4), pp. 521-523.

*Primary Examiner* — Julia Slutsker
(74) *Attorney, Agent, or Firm* — Slater Matsil, LLP

(57) ABSTRACT

A semiconductor device is disclosed. The semiconductor device includes a channel region, extending along a direction, that has a U-shaped cross-section; a gate dielectric layer wrapping around the channel region; and a gate electrode wrapping around respective central portions of the gate dielectric layer and the channel region.

20 Claims, 18 Drawing Sheets

(51) Int. Cl.
*B82Y 10/00* (2011.01)
*H01L 29/786* (2006.01)

(56) References Cited

U.S. PATENT DOCUMENTS

| | | |
|---|---|---|
| 9,406,748 B1 | 8/2016 | Balakrishnan et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2012/0187475 A1 | 7/2012 | Yamazaki et al. |
| 2015/0030299 A1 | 10/2015 | Chang et al. |
| 2015/0303299 A1* | 10/2015 | Chang .............. H01L 21/02568 257/29 |
| 2016/0005830 A1 | 1/2016 | Liao |
| 2016/0293705 A1 | 10/2016 | Lee et al. |
| 2017/0345921 A1* | 11/2017 | Feng ................. H01L 29/7786 |
| 2017/0345945 A1 | 11/2017 | Lee et al. |
| 2018/0158957 A1 | 6/2018 | Rachmady et al. |

\* cited by examiner

GAA FET WITH U-SHAPED CHANNEL

PRIORITY CLAIM

This application is a divisional of U.S. patent application Ser. No. 15/628,243, filed on Jun. 20, 2017, which application is hereby incorporated herein by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, functional density (i.e., the number of interconnected devices per chip area) has generally increased while geometry size (i.e., the smallest component that can be created using a fabrication process) has decreased. Despite advances in materials and fabrication, in order to further decrease the geometry size, conventional planar MOSFET devices have encounter challenging(s). As such, a variety of devices that are not planar-based or include non-planar components have attracted attention such as, for example, a FinFET device, etc.

Although FinFET devices have demonstrated decent operation performance, it is desired to further improve the performance of FinFET devices, in accordance with the semiconductor evolution. For example, a gate-all-around field-effect-transistor (GAA FET), typically having a gate feature that surrounds or wraps around a respective channel region, was proposed. When compared to the FinFET device, such a GAA FET can further enhance gate controllability over the respective channel region, which in turn provides various advantages over the FinFET devices such as, for example, a lower leakage current, a higher ratio of turn-on current to turn-off current, etc.

However, conventional techniques to make such a GAA FET, more specifically the respective channel region to be wrapped, typically rely on uncontrollable etching processes. As such, the channel region's geometric dimension cannot be well controlled, which results in various uncertainties in terms of a respective critical dimension (typically known as "CD") of the GAA FET. Thus, conventional techniques to make a GAA FET are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
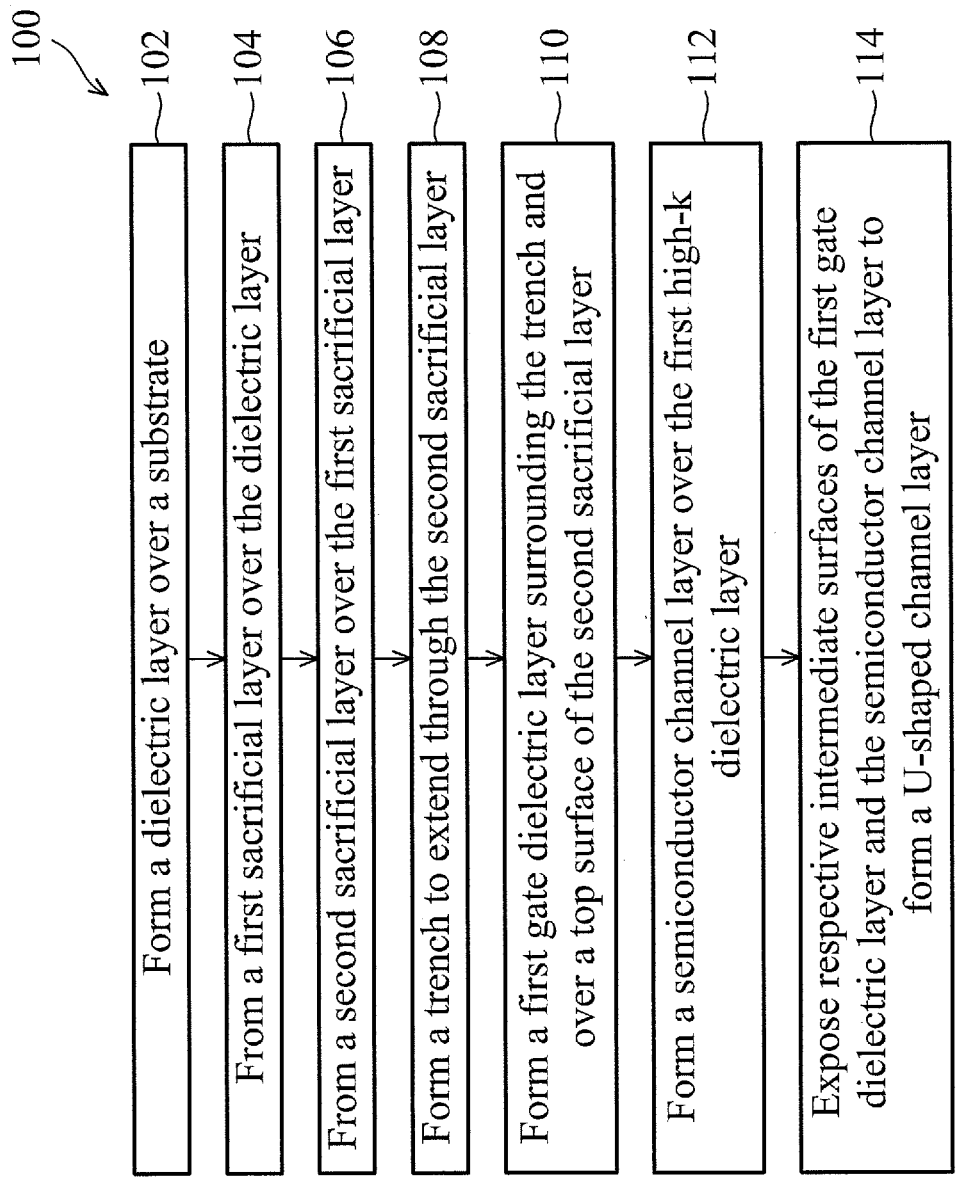
FIGS. 1A and 1B illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device (e.g., a GAA FET) that includes a gate electrode wrapping around a channel region that has a U-shaped cross-section, with an integrally formed gate dielectric layer disposed therebetween, and methods of forming the same. More particularly, in some embodiments, a first gate dielectric layer is formed to surround a well-defined trench region via a deposition technique (e.g., an atomic layer deposition (ALD) technique, a chemical vapor deposition (CVD) technique, etc.), which can be accurately controlled down to an atomic level. Then the channel region is formed by depositing a semiconductor layer over the first gate dielectric layer to surround the trench region by using the similar well-controlled deposition technique. Through one or more patterning and etching processes, part of the overlaid first gate dielectric layer is exposed so as to allow a second gate dielectric layer to be formed to couple the first gate dielectric layer, using the similar deposition technique. In some embodiments, the first and second gate dielectric layers can be formed of the same gate dielectric material such that an integrally formed gate dielectric layer is formed to surround the channel region. Moreover, in some embodiments, a U-shaped structure including the channel region, with a U-shaped cross-section, wrapped by the respective gate dielectric layer is formed. Subsequently, the gate electrode is further formed to surround the channel region and the respective gate dielectric layer. Thus, in contrast to conventional techniques as mentioned above, the channel region's geometric dimension (e.g., the U-shaped cross-section) of the disclosed GAA FET can be accurately controlled.

Figure 1B:
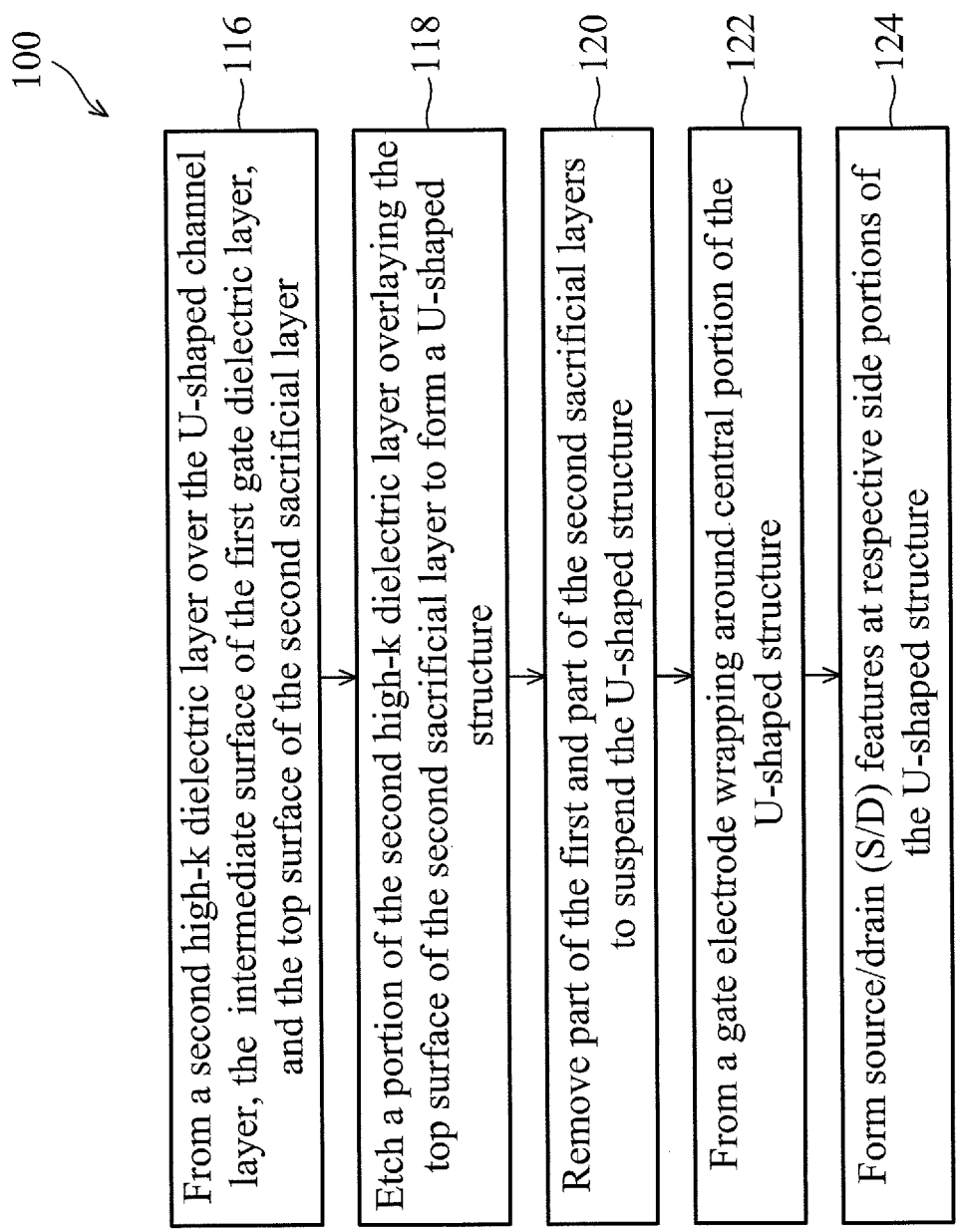

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a gate-all-around field-effect-transistor (GAA FET). As employed by the present disclosure, the GAA FET refers to any transistor including a gate wrapping around its respective channel region. It is noted that the method of FIGS. 1A and 1B does not produce a completed GAA FET. A completed GAA FET may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein.

Referring first to FIG. 1A, in some embodiments, the method 100 starts with operation 102 in which a dielectric layer is formed over a semiconductor substrate (hereinafter "substrate"). The method 100 continues to operation 104 in which a first sacrificial layer is formed over the dielectric layer. The method 100 continues to operation 106 in which a second sacrificial layer is formed over the first sacrificial layer. In some embodiments, the first sacrificial layer and the second sacrificial layer may be each formed of a respective different material, as will be discussed in further detail below. The method 100 continues to operation 108 in which a trench is formed to extend through the second sacrificial layer (i.e., formed in the second sacrificial layer). More specifically, in some embodiments, when the trench is formed, a portion of a top surface of the first sacrificial layer is exposed as a bottom surface of the trench, and inner sidewalls of a remaining portion of the second sacrificial layer are exposed as sidewalls of the trench. The method 100 continues to operation 110 in which a first gate dielectric layer is formed to surround the trench (i.e., overlaying the bottom surface and the sidewalls of the trench) and overlay a top surface of the second sacrificial layer. As such, in some embodiments, the first gate dielectric layer may include at least three portions: a first portion that overlays the bottom surface of the trench; a second portion that extends along respective sidewalls of the trench; and a third portion that overlays the top surface of the second sacrificial layer.

The method 100 continues to operation 112 in which a semiconductor channel layer, which will be used to form a channel region of the GAA FET, is formed over the first gate dielectric layer. That is, the semiconductor channel layer, at least part of, is formed to surround the trench (i.e., overlaying the bottom surface and the sidewalls of the trench) with the first gate dielectric layer disposed therebetween. As such, in some embodiments, the semiconductor channel layer may similarly include at least three portions: a first portion that overlays the first portion of the first gate dielectric layer; a second portion coupled to the second portion of the first gate dielectric layer; and a third portion that overlays the third portion of the first gate dielectric layer.

The method 100 continues to operation 114 in which the respective third portions of the first gate dielectric layer and the semiconductor channel layer, and an upper portion of the second portion of the semiconductor channel layer are removed (e.g., etched) so as to expose respective intermediate surfaces of the first gate dielectric layer and the semiconductor channel layer. In accordance with some embodiments, the intermediate surface of the first gate dielectric layer may be a top surface of the second portion of the first gate dielectric layer; and the intermediate surface of the semiconductor channel layer may be a top surface of a remaining portion of the second portion of the semiconductor channel layer. As such, in some embodiments, after the respective intermediate surfaces of the first gate dielectric layer and the semiconductor channel layer are exposed in operation 114, the first and second portions of the first gate dielectric layer are left remaining; and the first portion and the remaining portion of the second portion of the semiconductor channel layer are left remaining. In some embodiments, the remaining portions of the semiconductor channel layer (i.e., the first portion and the remaining portion of the second portion of the semiconductor channel layer) may be formed to have a U-shaped cross-section, hereinafter "U-shaped channel layer."

Referring to FIG. 1B, the method 100 continues to operation 116 in which a second gate dielectric layer is formed over the U-shaped channel layer, the intermediate surface of the first gate dielectric layer, and the top surface of the second sacrificial layer. In some embodiments, the second gate dielectric layer is substantially similar to the first gate dielectric layer. As such, the first and second gate dielectric layers may be integrally formed to surround the U-shaped channel layer. The method 100 continues to operation 118 in which a portion of the second gate dielectric layer that overlays the top surface of the second sacrificial layer is removed. In some embodiments, when the portion of the second gate dielectric layer that overlays the top surface of the second sacrificial layer is removed, a U-shaped structure, including the U-shaped channel layer and a respective gate dielectric layer wrapping around it, is formed. More specifically, the respective gate dielectric layer, wrapping the U-shaped channel layer, may include the first gate dielectric layer surrounding the trench (i.e., the remaining first and second portions of the first gate dielectric layer), and the portions of the second gate dielectric layer overlaying the U-shaped channel layer and the intermediate surfaces of the first gate dielectric layer.

The method 100 continues to operation 120 in which part of the first and part of the second sacrificial layers are, respectively or concurrently, removed so as to suspend the U-shaped structure (i.e., the U-shaped channel layer and the gate dielectric layer wrapping it). The method 100 continues to operation 122 in which a gate electrode is formed to wrap around a central portion of the U-shaped structure. The method 100 continues to operation 124 in which source/drain features are formed on respective side portions (i.e., the portions that are not surrounded by the gate electrode) of the U-shaped structure.

Figure 3:
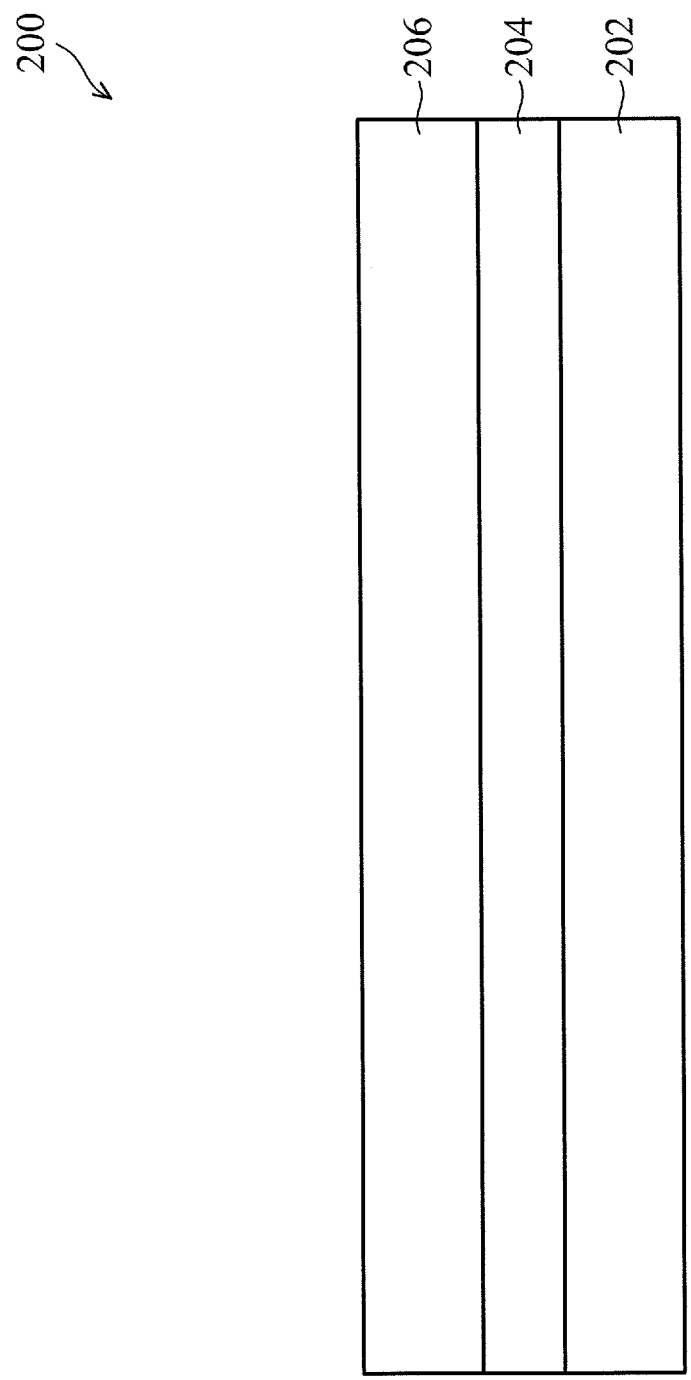
Figure 4:
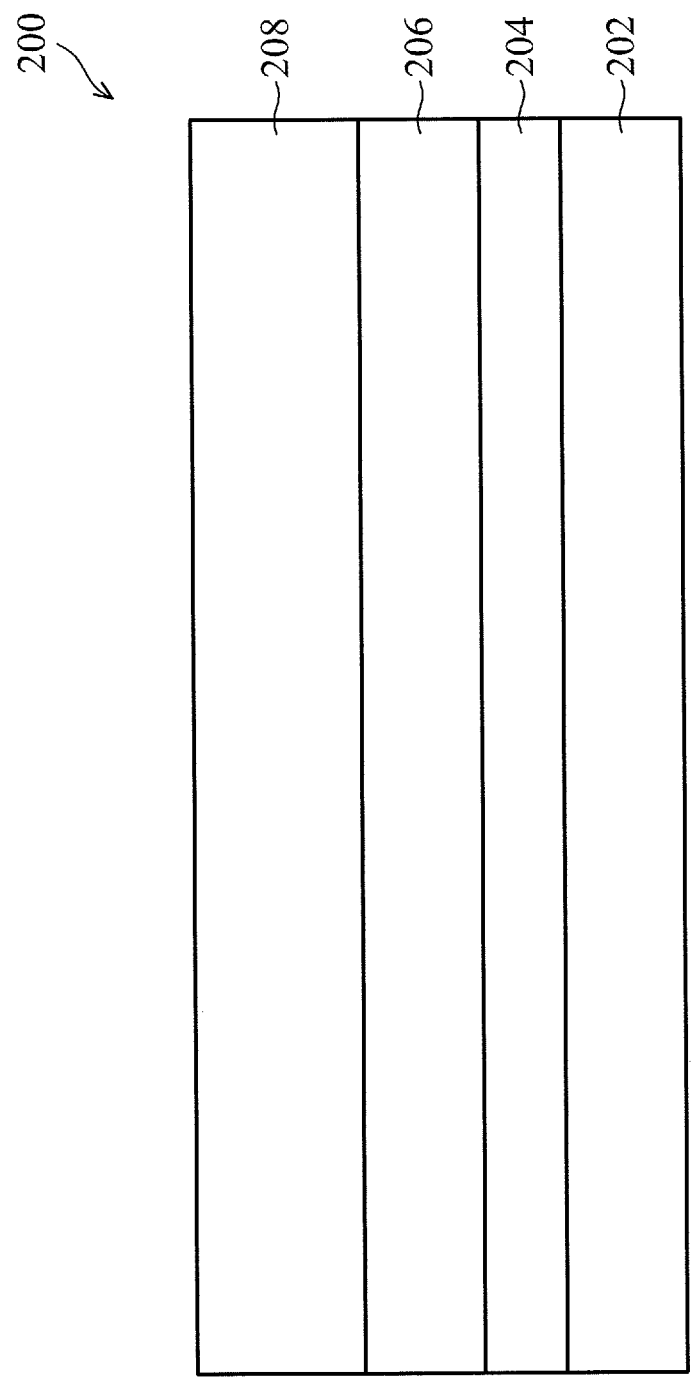
Figure 5A:
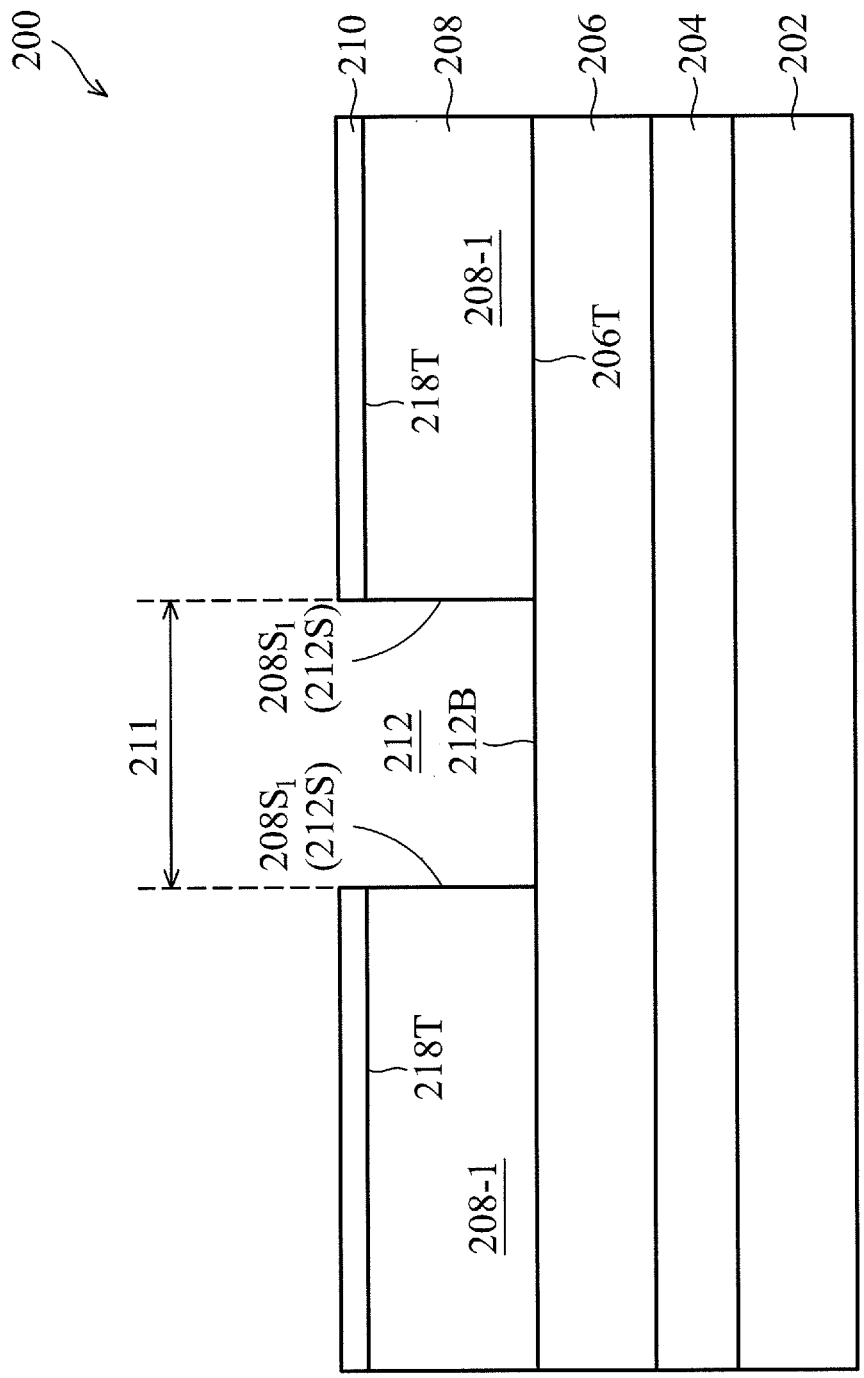
Figure 5B:
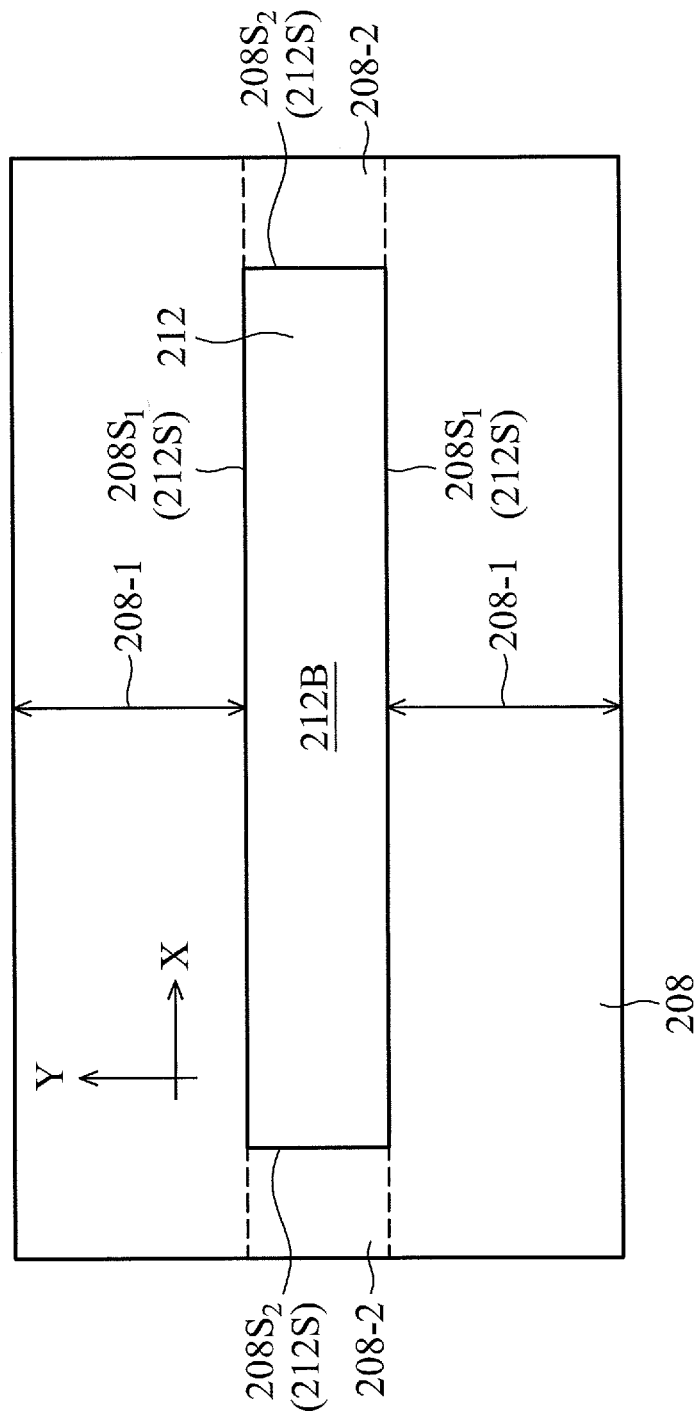
FIG. 5B illustrates a corresponding top view of FIG. 5A, in accordance with some embodiments.
Figure 8:
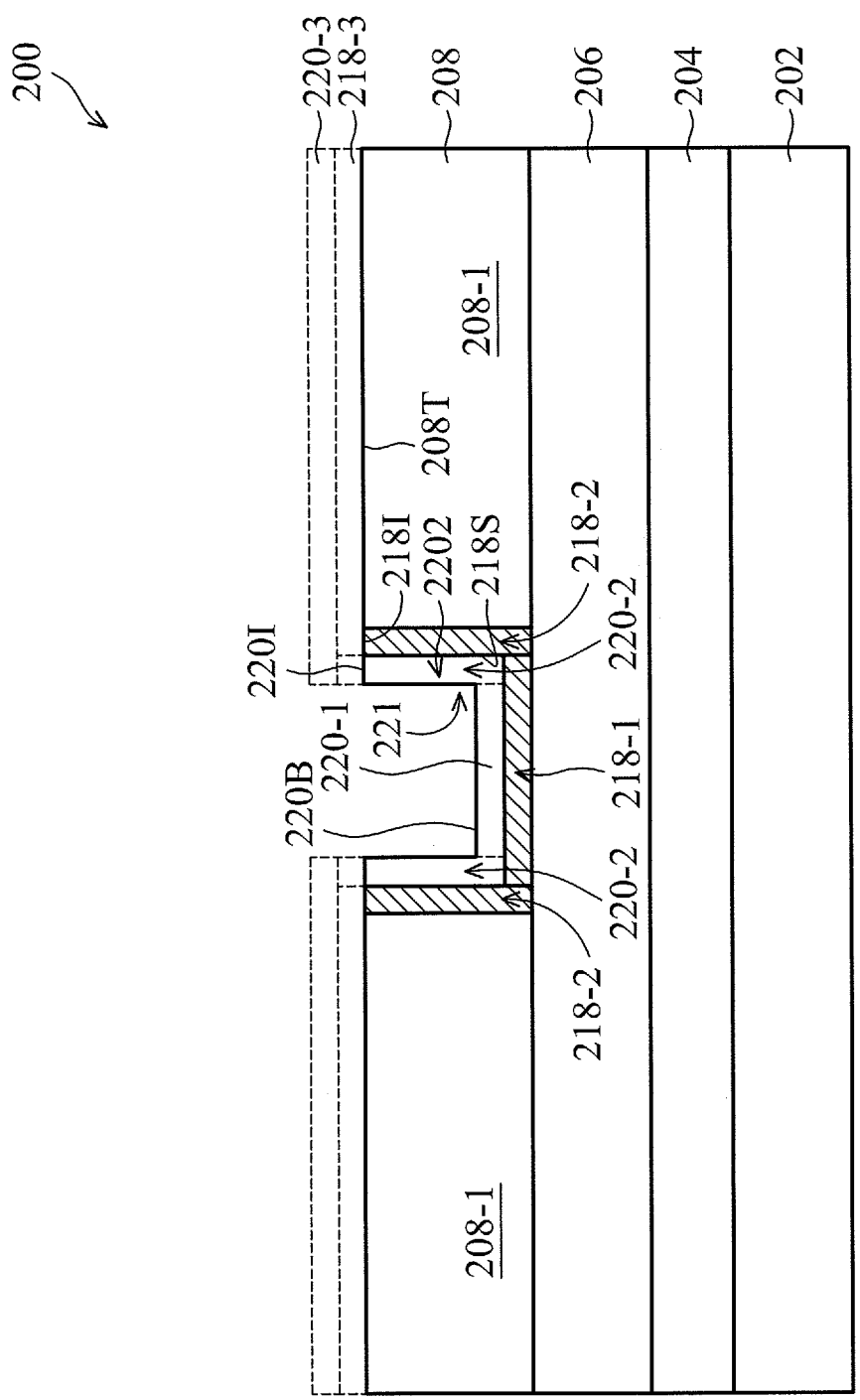
Figure 9:
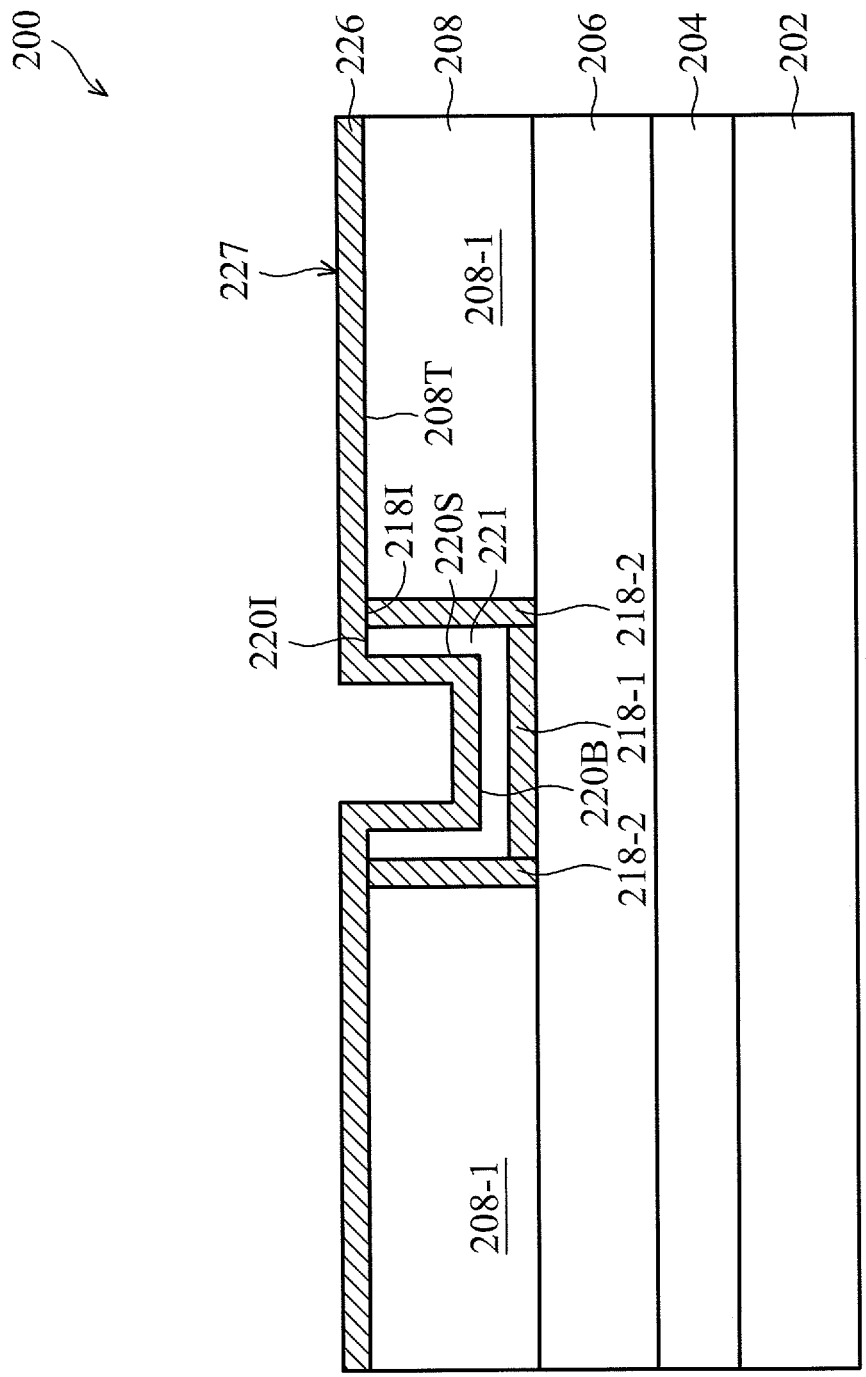
Figure 10A:
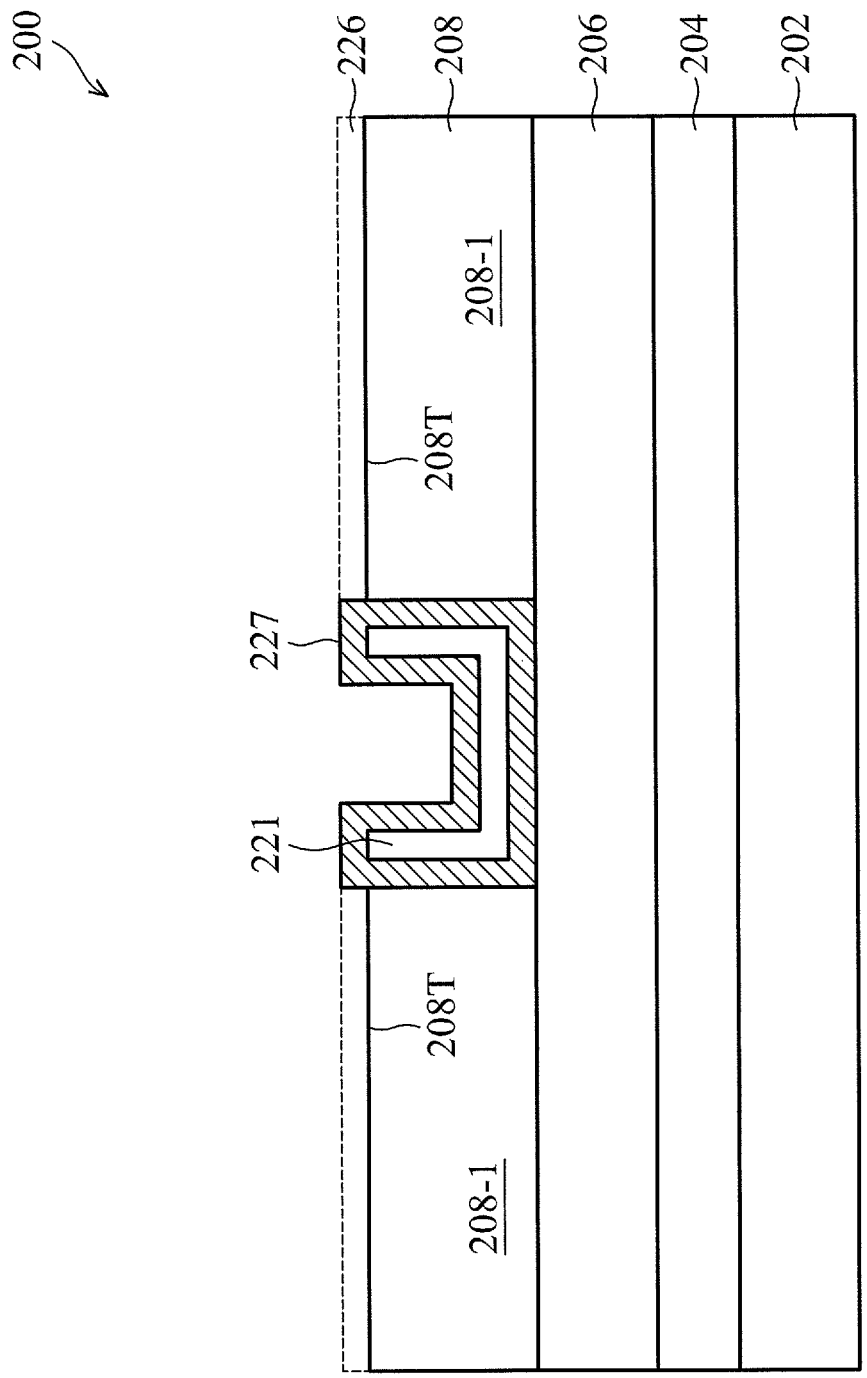
Figure 10B:
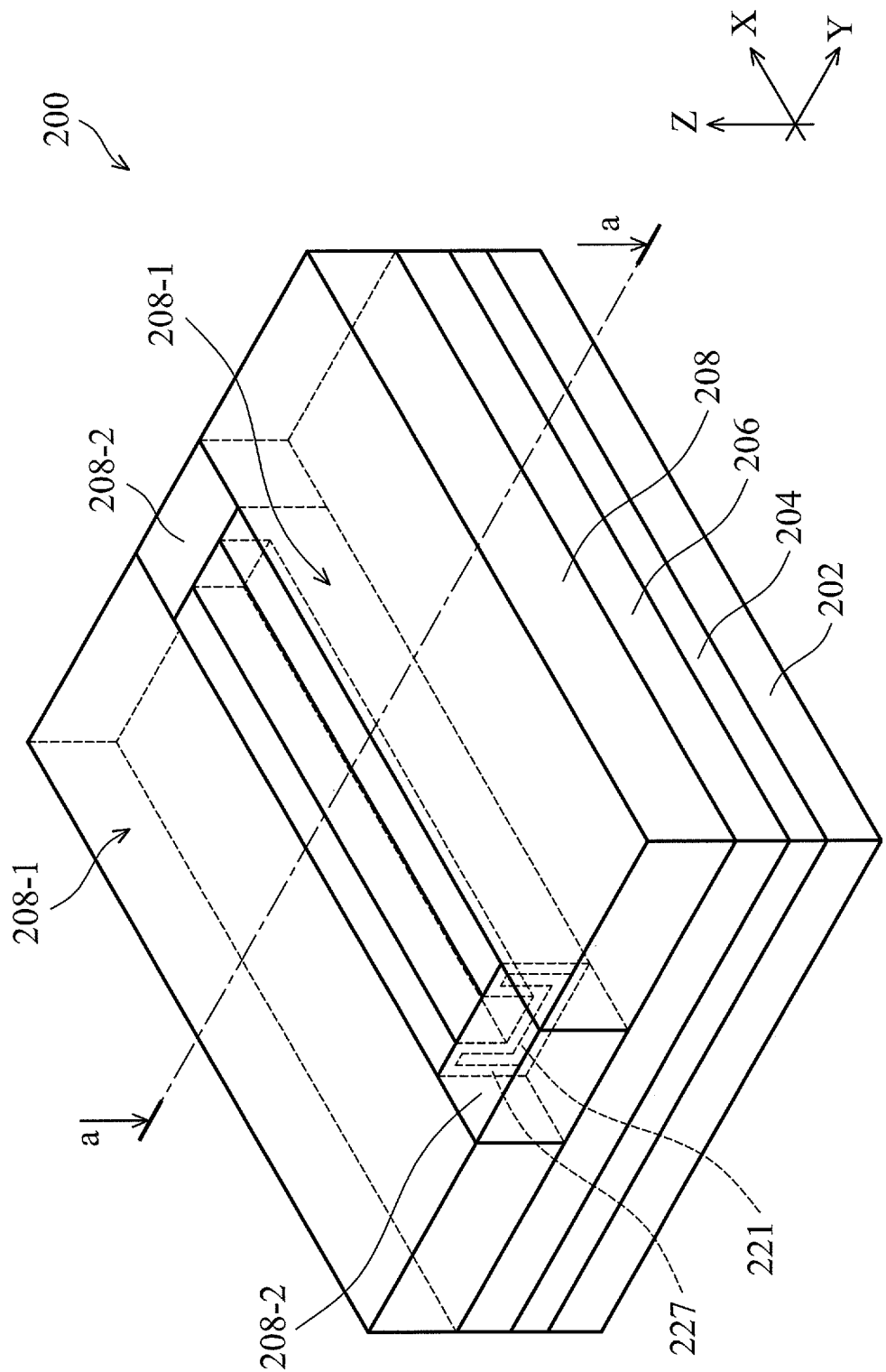
FIGS. 10B, 11B, and 12B illustrate corresponding perspective views of FIGS. 10A, 11A, and 12A, in accordance with some embodiments.
Figure 11A:
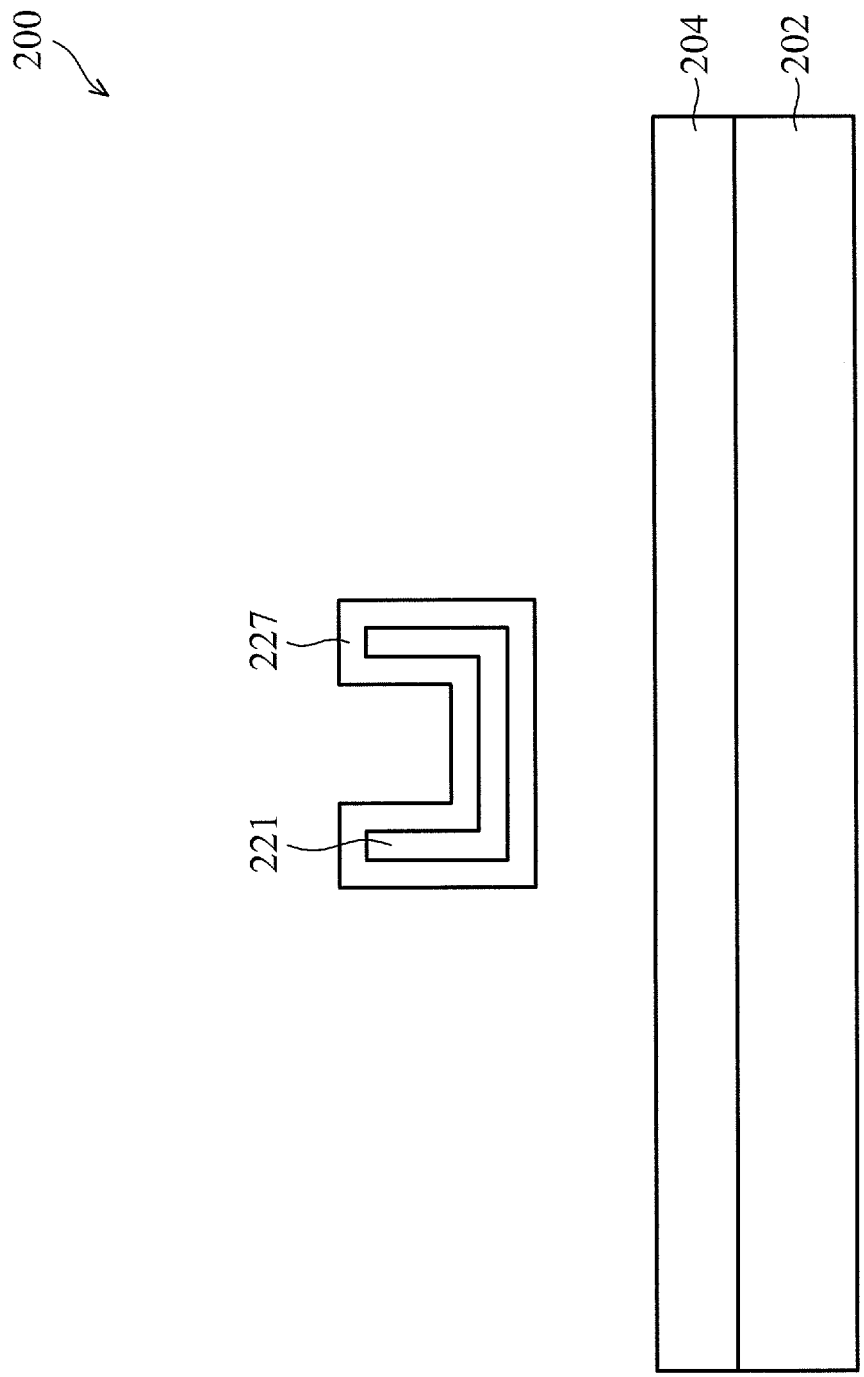
Figure 11B:
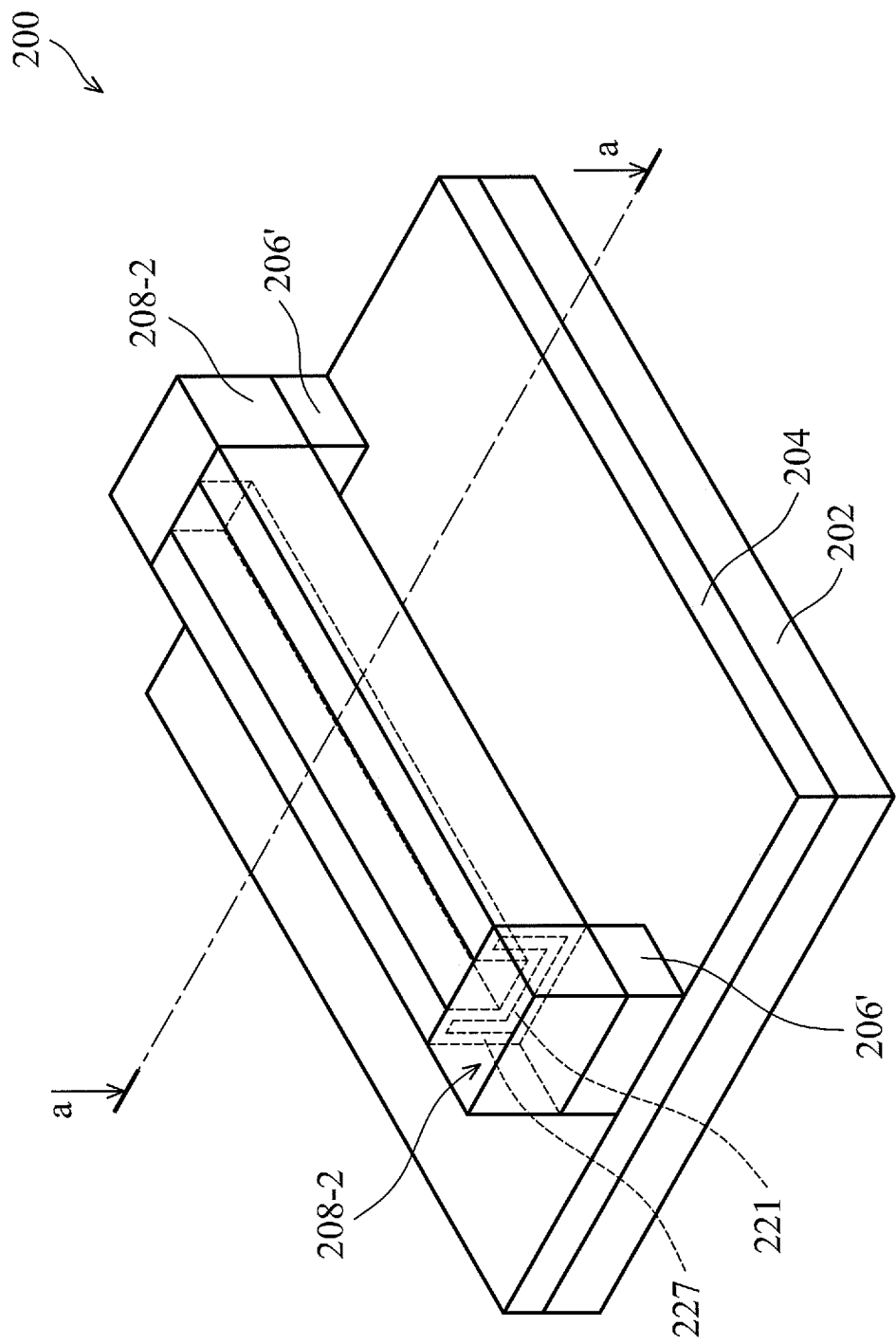
Figure 12A:
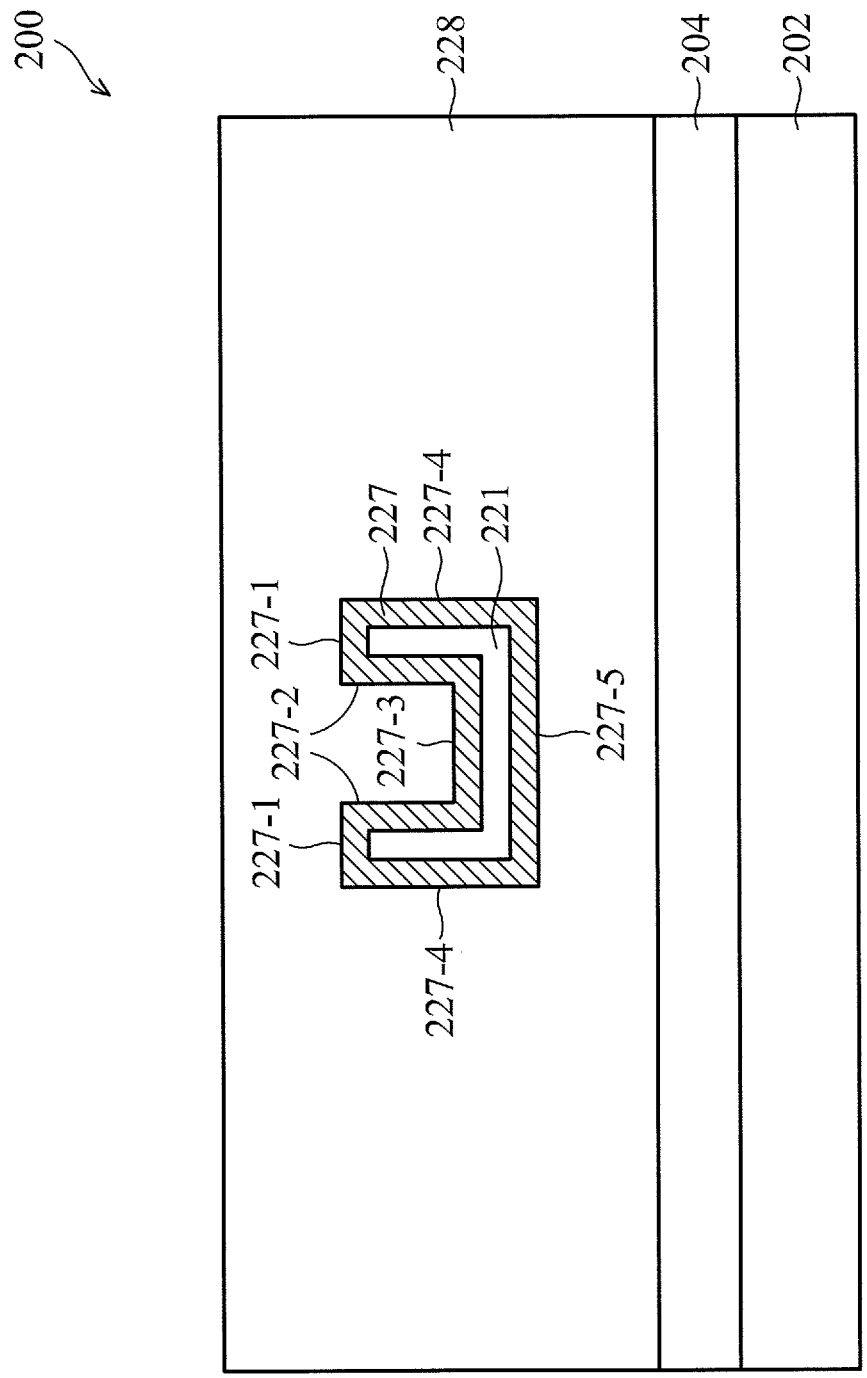
Figure 12B:
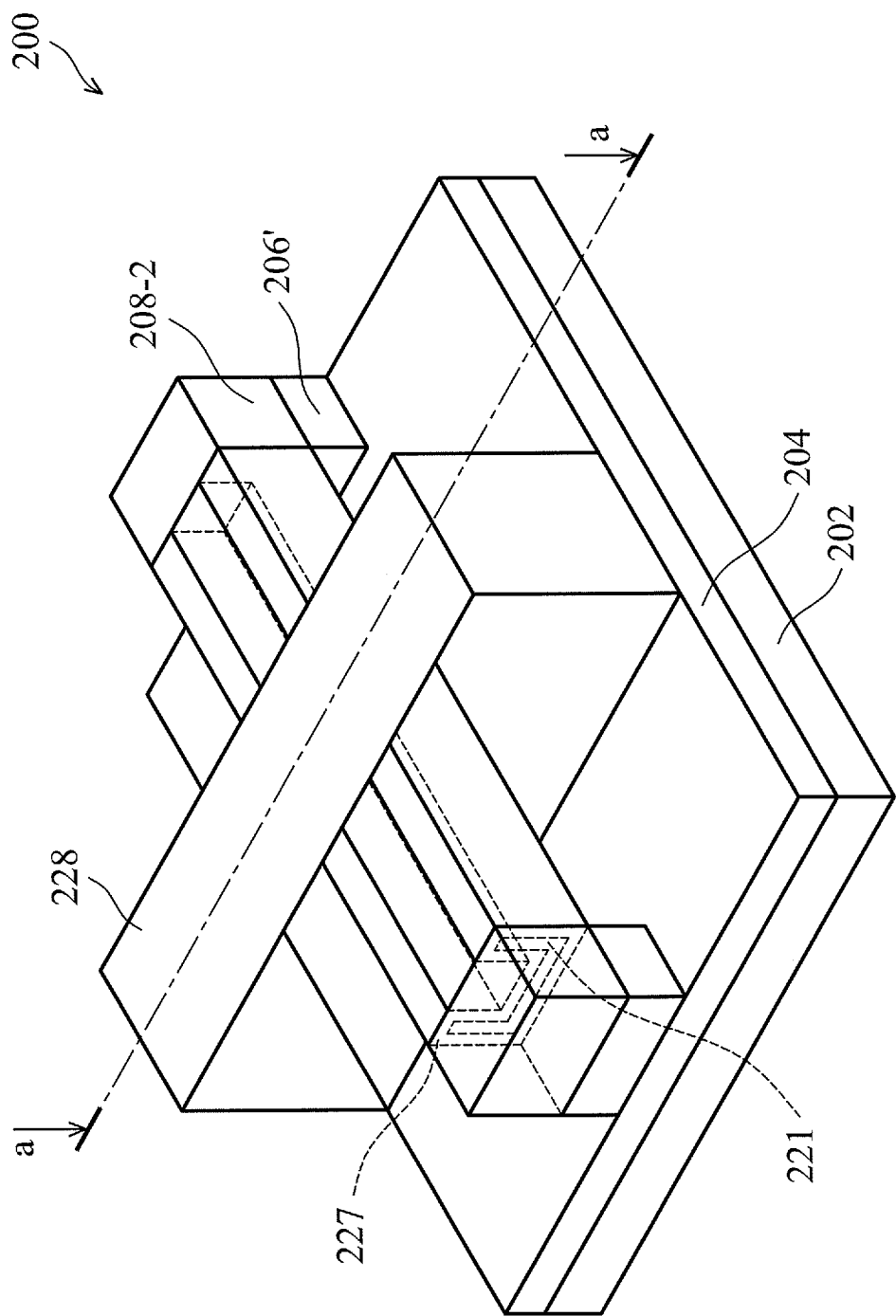
Figure 13:
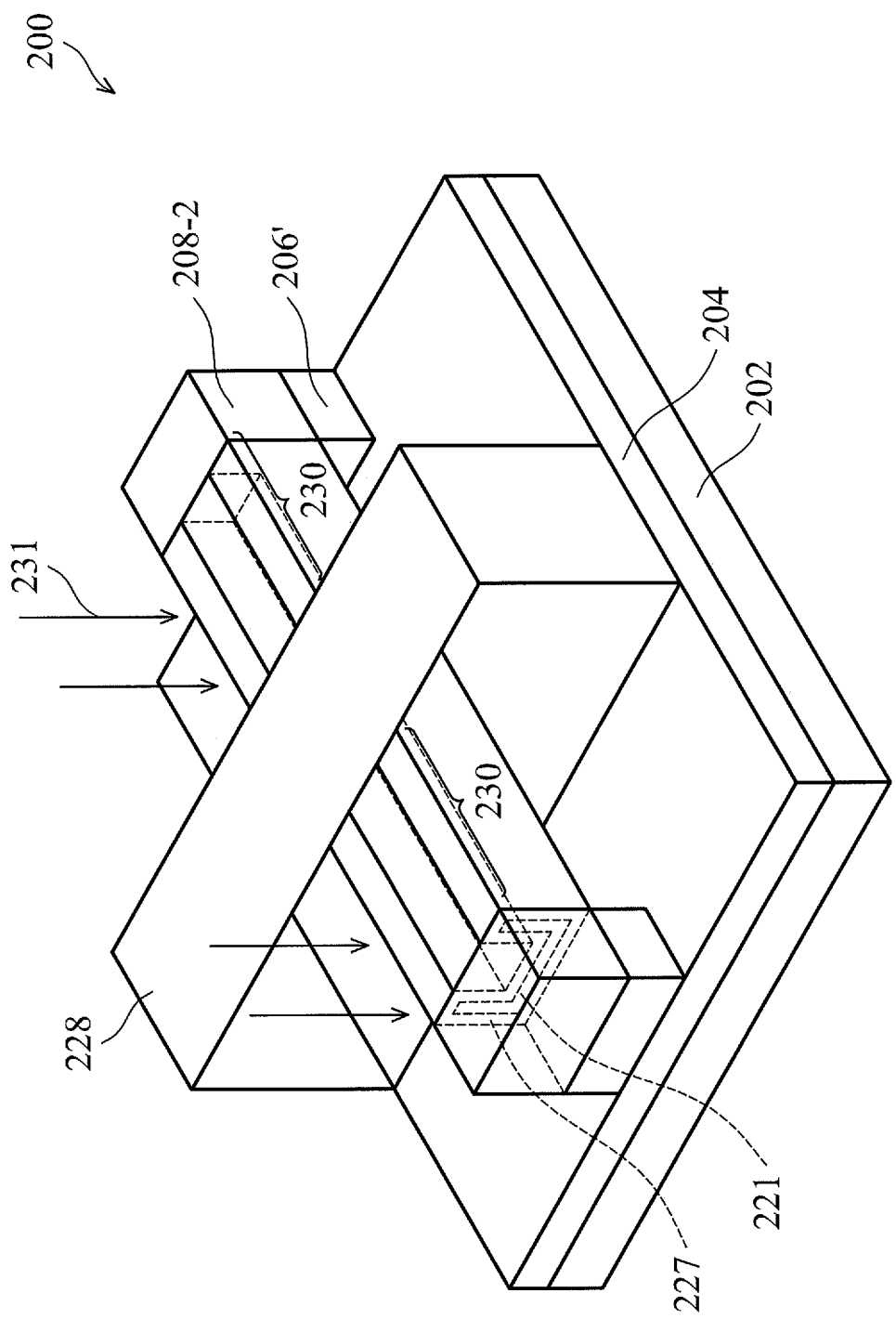
FIG. 13 illustrates a perspective view of the exemplary semiconductor device, made by the method of FIGS. 1A-1B, at one of various fabrication stages, in accordance with some embodiments.

In some embodiments, operations of the method 100 may be associated with cross-sectional views of a semiconductor device 200 at various fabrication stages as shown in FIGS. 2, 3, 4, 5A, 6, 7, 8, 9, 10A, 11A, and 12A, respectively, and a perspective view of the semiconductor device 200 at one of various fabrication stages as shown in FIG. 13. For purpose of clarity, a top view corresponding to the cross-sectional view in FIG. 5A is illustrated in FIG. 5B; and perspective views corresponding the cross-sectional views of FIGS. 10A, 11A, and 12A are illustrated in FIGS. 10B, 11B, and 12B, respectively.

In some embodiments, the semiconductor device 200 may be a GAA FET. The GAA FET 200 may be included in a microprocessor, memory cell, and/or other integrated circuit (IC). Also, FIGS. 2 through 13 are simplified for a better understanding of the concepts of the present disclosure. For example, although the figures illustrate the GAA FET 200, it is understood the IC may comprise a number of other devices comprising resistors, capacitors, inductors, fuses, etc., which are not shown in FIGS. 2 through 13, for purposes of clarity of illustration.

Figure 2:
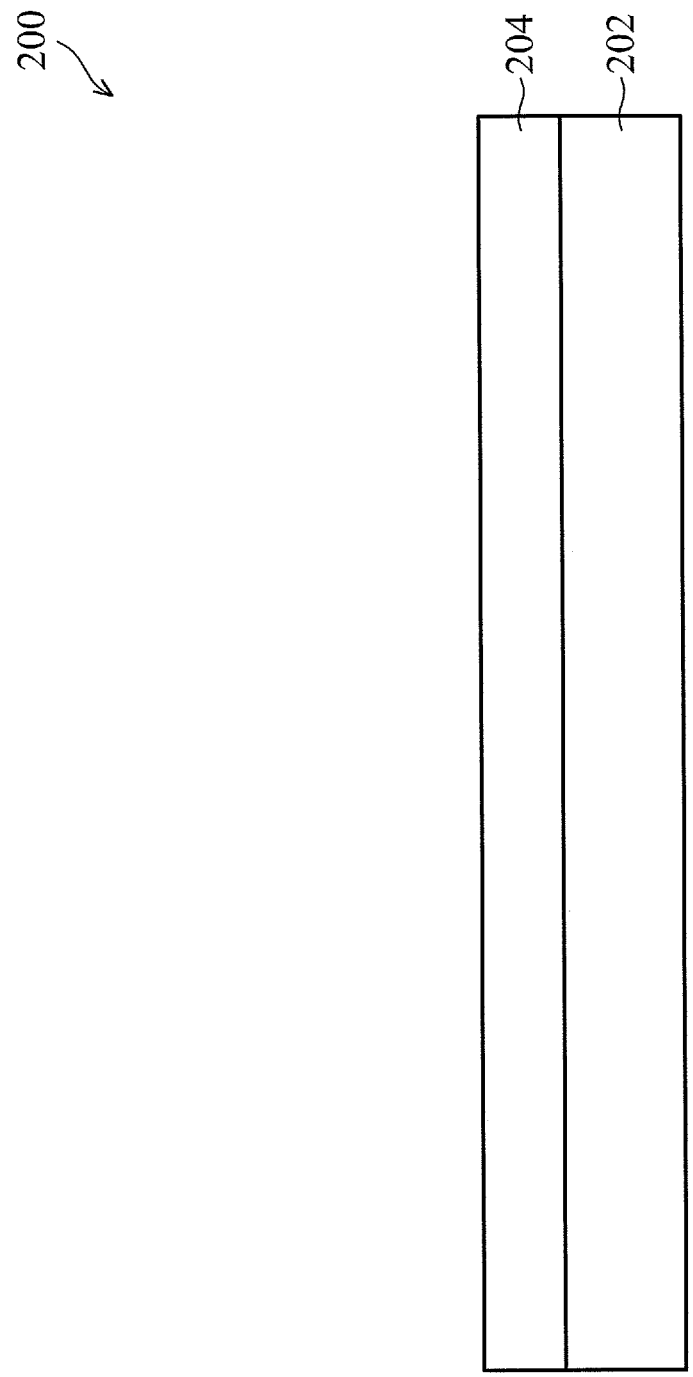
FIGS. 2, 3, 4, 5A, 6, 7, 8, 9, 10A, 11A, and 12A illustrate cross-sectional views of an exemplary semiconductor device, made by the method of FIGS. 1A-1B, during various fabrication stages, in accordance with some embodiments.

Corresponding to operation 102 of FIG. 1A, FIG. 2 is a cross-sectional view of the GAA FET 200 including a substrate 202 overlaid by a dielectric layer 204 at one of the various stages of fabrication, according to some embodiments. In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the dielectric layer 204 is formed of a dielectric material that is selected from at least one of: silicon oxide ($SiO_2$), silicon nitride (SiN), silicon carbide (SiC), silicon oxynitride (SiON), $Al_2O_3$, $Cu_xO_y$ (where x=1 or 2; and y=1, 2, or 3), $M_xO_y$ (where M=Ni, Zn, LaMn, $La_2Cu$; x=1 or 2; and y=1, 2, or 3), a low dielectric constant (low-k) material, other suitable dielectric materials, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The dielectric layer 204 may be formed using at least one of chemical vapor deposition (CVD), physical vapor deposition (PVD), spin-on coating, and/or other suitable techniques to deposit one of the above-mentioned materials on the substrate 202.

Corresponding to operation 104 of FIG. 1A, FIG. 3 is a cross-sectional view of the GAA FET 200 including a first sacrificial layer 206 being formed over the dielectric layer 204 at one of the various stages of fabrication, according to some embodiments. In some embodiments, the first sacrificial layer 206 is formed of a material that can be selected from a polycrystalline silicon (hereinafter "Poly Si"), a nanowire material, or a combination thereof. The nanowire material may include silicon, germanium, silicon-germanium, III-V compound semiconductor materials, and/or other future developed nanowire materials. The first sacrificial layer 206 may be formed using at least one of chemical vapor deposition (CVD), metal organic chemical vapor deposition (MOCVD), physical vapor deposition (PVD), spin-on coating, and/or other suitable techniques to deposit one of the above-mentioned materials on the dielectric layer 204.

Corresponding to operation 106 of FIG. 1A, FIG. 4 is a cross-sectional view of the GAA FET 200 including a second sacrificial layer 208 being formed over the first sacrificial layer 206 at one of the various stages of fabrication, according to some embodiments. In some embodiments, the second sacrificial layer 208 is formed of a dielectric material that is different from the material of the first sacrificial layer 206. For example, the second sacrificial layer 208 may be formed silicon oxide ($SiO_2$), silicon nitride (SiN), silicon carbide (SiC), silicon oxynitride (SiON), $Al_2O_3$, $Cu_xO_y$ (where x=1 or 2; and y=1, 2, or 3), $M_xO_y$ (where M=Ni, Zn, LaMn, $La_2Cu$; x=1 or 2; and y=1, 2, or 3), other suitable dielectric materials, or a combination thereof. As will be discussed in further detail below, by using respective different materials to form the first and second sacrificial layers 206 and 208, a profile of a later formed trench can be more clearly defined, which in turn may help define the geometric dimension of the GAA FET 200's channel region. However, in some alternative embodiments, the first and second sacrificial layers 206 and 208 may be formed of a substantially similar material while remaining within the scope of the present disclosure. Similarly, the second sacrificial layer 208 may be formed using at least one of chemical vapor deposition (CVD), physical vapor deposition (PVD), spin-on coating, and/or other suitable techniques to deposit one of the above-mentioned materials on the first sacrificial layer 206.

Corresponding to operation 108 of FIG. 1A, FIG. 5A is a cross-sectional view of the GAA FET 200 including a trench 212 being formed in the second sacrificial layer 208 at one of the various stages of fabrication, according to some embodiments. As shown, the trench 212 is formed to extend through the second sacrificial layer 208. The trench 212 includes a bottom surface 212B and sidewalls 212S. More specifically, the bottom surface 212B of the trench 212 is an exposed portion of a top surface 206T of the first sacrificial layer 206 that is disposed between two remaining portions 208-1 of the second sacrificial layer 208, and the sidewalls 212S of the trench 212 are inner sidewalls of the remaining portions 208-1 of the second sacrificial layer 208.

In some embodiments, the trench 212 may be formed by at least some of the following process steps: forming a patterned layer 210 (e.g., a photoresist layer) with an opening 211 over the second sacrificial layer 208 (FIG. 4); using the patterned layer 210 as a mask to perform at least an etching process (e.g., a dry or wet etching process) on the second sacrificial layer 208 so as to expose a portion of the top surface 206T of the first sacrificial layer 206 (i.e., the bottom surface 212B); and performing one or more cleaning processes. In some embodiments, after the formation of the trench 212, the patterned layer 210 may be subsequently removed such that a top surface 208T of the second sacrificial layer 208 is again exposed.

It is noted that the trench 212 may be formed within a limited area of the second sacrificial layer 208, in accordance with some embodiments. For purposes of clarification, a top view of the GAA FET 200, corresponding to operation 108 (and the cross-sectional view of FIG. 5A), is illustrated in FIG. 5B. As shown, the trench 212 is formed as a recessed portion of the second sacrificial layer 208 thereby exposing the portion of the top surface 206T of the first sacrificial layer 206 to form the bottom surface 212B of the trench 212. Further, in some embodiments, the trench 212 extends along a first direction (e.g., the Y direction) with the remaining portions 208-1 of the second sacrificial layer 208 serving as walls so as to define the respective inner sidewalls 208S1 (the sidewalls 212S of the trench 212), and further along a second direction (e.g., the X direction) with remaining portions 208-2 of the second sacrificial layer 208 serving as other walls so as to define respective inner sidewalls 208S2 (also the sidewalls 212S of the trench 212).

In some embodiments, the walls 208-2 may remain intact at least during some of the following operations, as will be discussed in further detail below.

Figure 6:
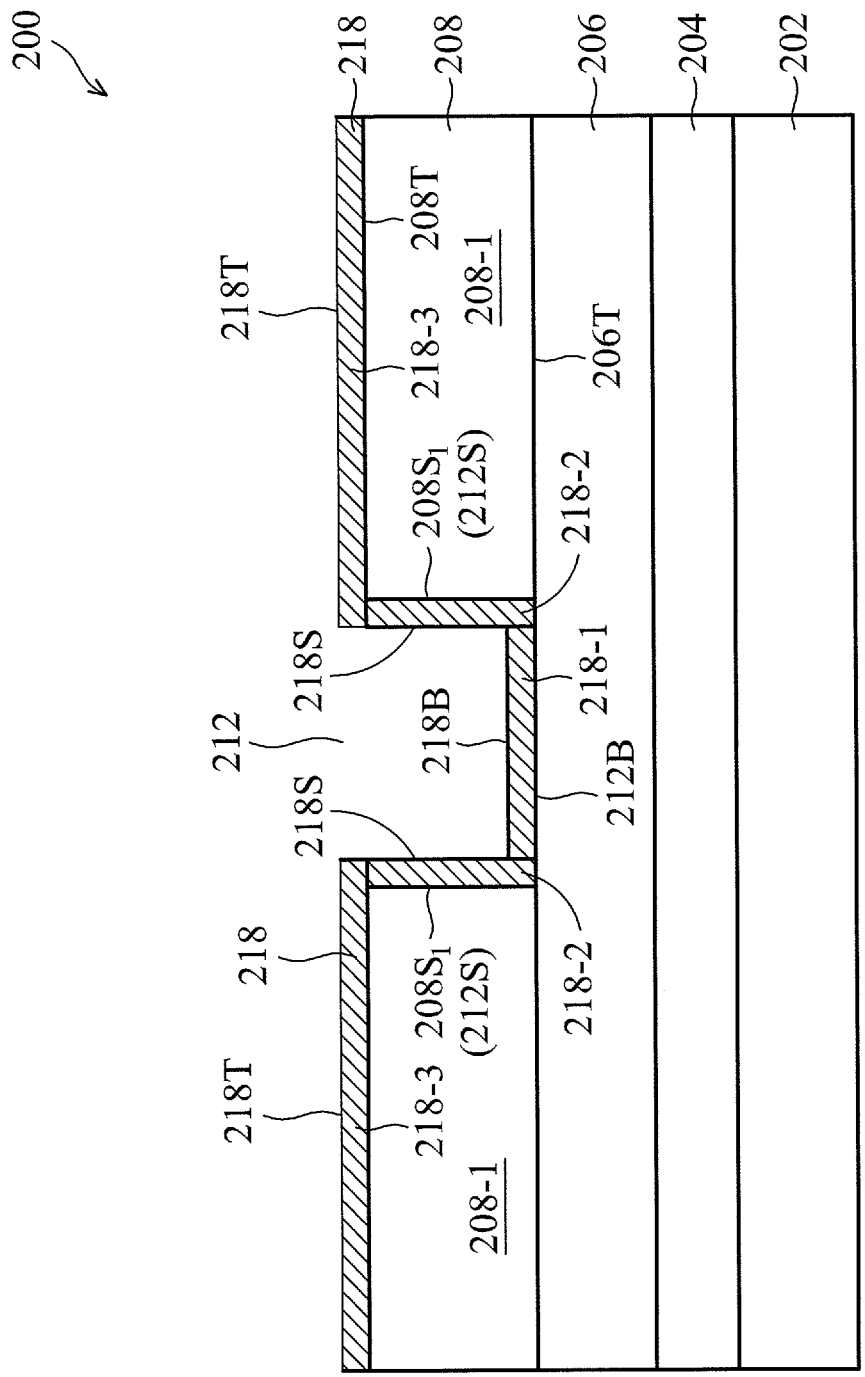

Corresponding to operation 110 of FIG. 1A, FIG. 6 is a cross-sectional view of the GAA FET 200 including a first gate dielectric layer 218 being formed over the trench 212 and the second sacrificial layer 208 at one of the various stages of fabrication, according to some embodiments. In some embodiments, the first gate dielectric layer 218 is integrally formed as a conformal layer (i.e., with a substantially conformal thickness) to surround the trench 212 and overlay the second sacrificial layer 208, respectively. Such a conformal thickness (e.g., about 1 to 2 nanometers) of the first gate dielectric layer 218 may be substantially thinner when compared to a thickness of the second sacrificial layer 208 (e.g., about several microns), which allows at least part of the first gate dielectric layer 218 to follow the trench 212's "trench" profile, as discussed in further detail below.

In addition to the substantially thin thickness of the first gate dielectric layer 218, the first gate dielectric layer 218 is formed to cover the bottom surface 212B of the trench 212 and the top surface 208T of the second sacrificial layer 208, and extend along sidewalls 212S of the trench 212. As such, the first gate dielectric layer 218 can also be formed to have a "trench" profile that includes at least three portions: horizontal portions 218-1 and 218-3, and vertical portions 218-2, which will be respectively discussed in further detail below.

The horizontal portion 218-1 overlays the bottom surface 212B of the trench 212 to provide a bottom surface 218B that is substantially aligned to the bottom surface 212B of the trench 212. The vertical portions 218-2 each extends along the respective sidewall 212S to provide a respective sidewall 218S that is substantially aligned to the sidewall 212S of the trench 212. In some embodiments, the horizontal portion 218-3 overlays the top surface 208T of the second sacrificial layer 208 to provide a top surface 218T that is substantially aligned to the top surface 208T of the second sacrificial layer 208. In some embodiments, although not shown for purposes of brevity, the first gate dielectric layer 218 may include further portions that are formed to extend along the inner sidewalls 208S2 of the second sacrificial layer 208 (FIG. 5B) as well.

In some embodiments, the first gate dielectric layer 218 may be formed of a high-k dielectric material. Such a high-k dielectric material may have a "k" value greater than about 4.0, or even greater than about 7.0. In such embodiments, the high-k dielectric layer 218 may be formed of at least one material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or a combination thereof. The high-k dielectric layer 218 may be formed using a suitable process such as ALD, CVD, PVD, plating, or combinations thereof.

Figure 7:
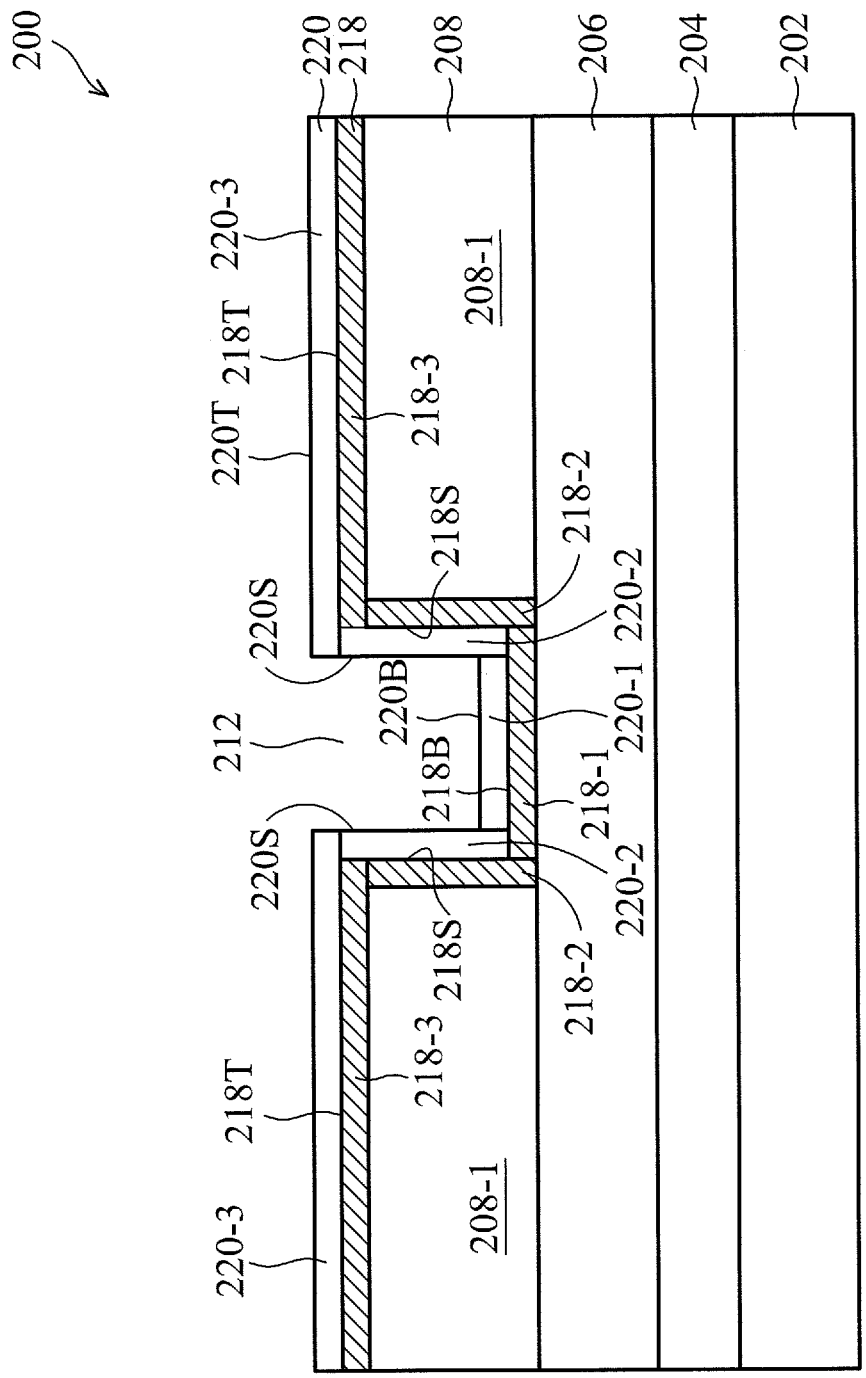

Corresponding to operation 112 of FIG. 1A, FIG. 7 is a cross-sectional view of the GAA FET 200 including a semiconductor channel layer 220 being formed over the first gate dielectric layer 218 at one of the various stages of fabrication, according to some embodiments. Similar to the first gate dielectric layer 218, the semiconductor channel layer 220 is also integrally formed as a conformal layer to overlay the first gate dielectric layer 218. Still similarly, the semiconductor channel layer 220 has a respective conformal thickness (e.g., about 1 to 100 nanometers) that is substantially thinner than the thickness of the second sacrificial layer 208 (e.g., about several microns), which allows the semiconductor channel layer 220 to follow the trench 212's "trench" profile, as discussed in further detail below.

In addition to the substantially thin thickness of the semiconductor channel layer 220, the semiconductor channel layer 220 is formed to overlay the bottom surface 218B and the top surface 218T of the first gate dielectric layer 218, and extend along the sidewalls 218S. As such, the semiconductor layer 220 can also be formed to have a "trench" profile that includes at least three portions: horizontal portions 220-1 and 220-3, and vertical portions 220-2, which will be respectively discussed in further detail below.

The horizontal portion 220-1 overlays part of the horizontal portion 218-1 of the first gate dielectric layer 218 to provide a bottom surface 220B that is substantially aligned to the bottom surface 218B of the first gate dielectric layer 218. The vertical 220-2 each extends along the respective sidewall 218S to provide a sidewall 220S that is substantially aligned to the sidewall 218S of the first gate dielectric layer 218. In some embodiments, the horizontal portion 220-3 overlays the top surface 218T of the first gate dielectric layer 218 to provide a top surface 220T that is substantially aligned to the top surface 218T of the first gate dielectric layer 218.

In some embodiments, the semiconductor channel layer 220 may be formed of crystalline silicon, germanium, silicon-germanium, III-V compound semiconductor materials, graphene, and/or other suitable materials. The semiconductor channel layer 220 may be formed using at least one of chemical vapor deposition (CVD), metal organic chemical vapor deposition (MOCVD), physical vapor deposition (PVD), and/or other suitable techniques to deposit one of the above-mentioned materials on the first gate dielectric layer 218. In some other embodiments, after the formation of the semiconductor channel layer 220, one or more doping processes (e.g., ion implantation processes, diffusion processes) may be performed to introduce dopants (e.g., boron, phosphorus, etc.) into the semiconductor channel layer 220.

Corresponding to operation 114 of FIG. 1A, FIG. 8 is a cross-sectional view of the GAA FET 200 including respective intermediate surfaces 218I and 220I of the first gate dielectric layer 218 and the semiconductor channel layer 220 being exposed at one of the various stages of fabrication, according to some embodiments. As shown, the intermediate surface 218I is a top surface of the vertical portion 218-2 of the first gate dielectric layer 218; and the intermediate surface 220M is a top surface of a remaining portion of the vertical portion 220-2 of the semiconductor channel layer 220.

In some embodiments, in order to cause the intermediate surfaces 218I and 220I to be exposed, the horizontal portion 218-3 of the first dielectric layer 218, the horizontal portion 220-3 of the semiconductor layer 220, and an upper portion of the vertical portion 220-2 of the semiconductor layer 220 (all shown in dotted lines) are, respectively or concurrently, to be removed (e.g., etched). In the illustrated embodiment of FIG. 8, the upper portion of the vertical portion 220-2 of the semiconductor layer 220 was disposed beneath the horizontal portion 220-3 and extends beyond a vertical projection of the sidewall 218S. Accordingly, after the intermediate surfaces 218I and 220I are exposed, the above-mentioned U-shaped channel layer is defined by the horizontal portion 220-1 and the remaining portions of the vertical portions 220-2 of the semiconductor channel layer 220. For clarity, such a U-shaped channel layer is herein referred to as "U-shaped channel layer 221."

In some embodiments, the intermediate surfaces 218I and 220I are exposed by at least some of the following process steps: forming a patterned mask layer that is aligned to cover the bottom surface 220B of the semiconductor channel layer 220; performing one or more dry/wet etching processes to, concurrently or respectively, remove the aforementioned portions 218-3, 220-3, and the upper portion of the vertical portion 220-2; and performing one or more cleaning processes.

Corresponding to operation 116 of FIG. 1B, FIG. 9 is a cross-sectional view of the GAA FET 200 including a second gate dielectric layer 226 being formed over the U-shaped channel layer 221 at one of the various stages of fabrication, according to some embodiments. Similar to the first gate dielectric layer 218 (discussed with respect to FIG. 6) and the semiconductor channel layer 220 (discussed with respect to FIG. 7), the second gate dielectric layer 226 is also integrally formed as a conformal layer with a substantially thin thickness (e.g., about 1 to 2 nanometers) to overlay the bottom surface 220B, the intermediate surfaces 218I and 220I, and the top surface 208T. Moreover, in some embodiments, the second gate dielectric layer 226 and the first gate dielectric layer 218 may be formed of a substantially similar material. Thus, the remaining portions of the first gate dielectric layer 218 (i.e., 218-1 and 218-2), and the second gate dielectric layer 226, in some embodiments, may be integrally formed as a gate dielectric layer wrapping around the U-shaped channel layer 221, herein referred to as "gate dielectric layer 227."

Similar to the first gate dielectric layer 218, in some embodiments, the second gate dielectric layer 226 may be formed of a high-k dielectric material. Such a high-k dielectric material may have a "k" value greater than about 4.0, or even greater than about 7.0. In such embodiments, the high-k dielectric layer 218 may be formed of at least one material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or a combination thereof. The high-k dielectric layer 226 may be formed using a suitable process such as ALD, CVD, PVD, plating, or combinations thereof.

Corresponding to operation 118 of FIG. 1B, FIG. 10A is a cross-sectional view of the GAA FET 200 including a portion of the second gate dielectric layer 226 being removed at one of the various stages of fabrication, according to some embodiments, and FIG. 10B is a perspective view corresponding to FIG. 10A. It is noted that the cross-sectional view of FIG. 10A is taken from line a-a of the perspective view of FIG. 10B.

As shown in the illustrated embodiment of FIG. 10A, the portion of the second gate dielectric layer 226 that overlays the top surface 208T of the second sacrificial layer 208 is removed such that the gate dielectric layer 227 is formed to closely wrap around the U-shaped channel layer 221, i.e., a U-shaped gate dielectric layer 227. In some embodiments, when the U-shaped channel layer 221 is wrapped by the respective U-shaped gate dielectric layer 227, a U-shaped structure, containing such two U-shaped channel layer 221 and gate dielectric layer 227, is formed, which is further illustrated in FIG. 10B.

In some embodiments, the U-shaped gate dielectric layer 227 may be formed by at least some of the following process steps: forming a patterned mask layer that is aligned to cover the top surfaces 208T of the second sacrificial layer 208; performing one or more dry/wet etching processes to remove the aforementioned portions of the second sacrificial layer 208; and performing one or more cleaning processes.

For purposes of illustration, FIG. 10B illustrates the perspective view of the GAA FET 200 corresponding to operation 118 of FIG. 1B, i.e., when the above-mentioned U-shaped structure (221 and 227) is formed, in accordance with various embodiments. Such a U-shaped structure (221 and 227) is partially embedded in the second sacrificial layer 208 with the walls 208-1 and 208-2 surrounding it. Moreover, the U-shaped structure (221 and 227) is formed to extend along the X-direction, which may be aligned with a direction in which carriers (e.g., holes and electrons) of the GAA FET 200 flow.

Corresponding to operation 120 of FIG. 1B, FIG. 11A is a cross-sectional view of the GAA FET 200 including respective portions of the first and second sacrificial layers 206 and 208 being removed such that the U-shaped structure (221 and 227) is suspended at one of the various stages of fabrication, according to some embodiments, and FIG. 11B is a perspective view corresponding to FIG. 11A. It is noted that the cross-sectional view of FIG. 11A is taken from line a-a of the perspective view of FIG. 11B. As shown in FIG. 11B, in some embodiments, the removed portions of the first and second sacrificial layers 206 and 208 include: the walls 208-1 of the second sacrificial layer 208 (shown in FIG. 10B), the portions of the first sacrificial layer 206 that is disposed underneath the walls 208-1, and the portion of the first sacrificial layer 206 that is disposed underneath the U-shaped structure (221 and 227). Accordingly, the U-shaped structure (221 and 227) may be suspended and anchored at respective ends by the walls 208-2 and respective remaining portions of the first sacrificial layer 206 disposed thereunder, e.g., 206'.

In some embodiments, the above-mentioned portions of the first and second sacrificial layers 206 and 208 may be removed by performing at least some of the following process steps: forming a patterned layer covering the U-shaped structure (221 and 227) and the walls 208-2; performing one or more dry/wet etching processes to, respectively or concurrently, remove the uncovered first and second sacrificial layers 206 and 208; and performing one or more cleaning processes.

Corresponding to operation 122 of FIG. 1B, FIG. 12A is a cross-sectional view of the GAA FET 200 including a gate electrode 228 being formed to wrap around the U-shaped structure (221 and 227) at one of the various stages of fabrication, according to some embodiments, and FIG. 12B is a perspective view corresponding to FIG. 12A. It is noted that the cross-sectional view of FIG. 12A is taken from line a-a of the perspective view of FIG. 12B. As shown in the illustrated embodiments of FIG. 12B, the gate electrode 228 is formed to wrap around a central portion of the U-shaped structure (221 and 227). More specifically, the gate electrode 228 is formed to be in contact with respective central portions of the U-shaped gate dielectric layer 227's outer surfaces: 227-1, 227-2, 227-3, 227-4, and 227-5, as shown in the cross-sectional view of FIG. 12A.

In some embodiments, the gate electrode 228 may include a metal material such as, for example, Al, Cu, W, Ti, Ta, TiN, TiAl, TiAlN, TaN, NiSi, CoSi, or combinations thereof. In some alternative embodiments, the gate electrode 228 may include a polysilicon material, wherein the polysilicon material may be doped with a uniform or non-uniform doping concentration. The gate electrode 228 may be formed using a suitable process such as ALD, CVD, PVD, plating, or combinations thereof.

Corresponding to operation 124 of FIG. 1B, FIG. 13 is a perspective view of the GAA FET 200 including source/drain features 230 being formed at side portions of the U-shaped structure (221 and 227) at one of the various stages of fabrication, according to some embodiments. As shown, the source/drain features 230 are formed at the side portions that are not covered by the gate electrode 228. In some embodiments, the formation of the source/drain features 230 may be formed by one or more ion implantation processes, or other suitable techniques (e.g., diffusion processes), 231 to introduce dopants (e.g., boron, phosphorous, etc.) into side portions of the U-shaped channel layer 221.

In an embodiment, a semiconductor device is disclosed. The semiconductor device includes a channel region, extending along a direction, that has a U-shaped cross-section; a gate dielectric layer wrapping around the channel region; and a gate electrode wrapping around respective central portions of the gate dielectric layer and the channel region.

In another embodiment, a method for forming a semiconductor device is disclosed. The method includes: forming a first sacrificial layer over a substrate; forming a second sacrificial layer over the first sacrificial layer; forming a trench extending through the second sacrificial layer; forming a first gate dielectric layer surrounding the trench; forming a semiconductor channel layer over the first gate dielectric layer; exposing respective top surfaces of vertical portions of the first gate dielectric layer and the semiconductor channel layer, wherein the vertical portions of the first gate dielectric layer each extends along a respective sidewall of the trench, and the vertical portions of the semiconductor channel layer are each coupled to the respective vertical portion of the first gate dielectric layer; and forming a second gate dielectric layer over the semiconductor channel layer so as to integrally form a gate dielectric layer wrapping around the semiconductor channel layer.

Yet in another embodiment, a semiconductor device includes a channel region that comprises a horizontal cross-section and two vertical cross-sections coupled to respective ends of the horizontal cross-section; and a gate electrode wrapping around a central portion of the channel region.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first sacrificial layer over a substrate;
    forming a second sacrificial layer over the first sacrificial layer;
    forming a trench extending through the second sacrificial layer;
    forming a first gate dielectric layer surrounding the trench;
    forming a semiconductor channel layer over the first gate dielectric layer;
    exposing respective top surfaces of vertical portions of the first gate dielectric layer and the semiconductor channel layer, wherein the vertical portions of the first gate dielectric layer each extends along a respective sidewall of the trench, and the vertical portions of the semiconductor channel layer are each coupled to the respective vertical portion of the first gate dielectric layer; and
    forming a second gate dielectric layer over the semiconductor channel layer so as to integrally form a gate dielectric layer wrapping around the semiconductor channel layer.

2. The method of claim 1, wherein the gate dielectric layer includes the first gate dielectric layer in the trench and at least part of the second gate dielectric layer.

3. The method of claim 1, wherein the semiconductor channel layer has a U-shaped cross-section.

4. The method of claim 3, wherein the U-shaped cross-section is defined by a horizontal portion of the semiconductor channel layer that is aligned with a bottom surface of the trench, and the vertical portions of the semiconductor channel layer.

5. The method of claim 1, wherein the first and second gate dielectric layers are formed of a substantially similar material.

6. The method of claim 1, further comprising:
    removing the first and second sacrificial layers so as to suspend the semiconductor channel layer wrapped by the respective gate dielectric layer;
    forming a gate electrode wrapping around a central portion of the semiconductor channel layer with the gate dielectric layer disposed therebetween; and
    forming source/drain features at respective side portions of the semiconductor channel layer.

7. The method of claim 1, wherein the gate dielectric layer has a thickness of about 1 to 2 nanometers.

8. The method of claim 1, wherein the first and second gate dielectric layers are formed of a high-k dielectric material.

9. A method of forming a semiconductor device, the method comprising:
    forming a first layer over a substrate;
    forming a second layer over the first layer;
    forming a trench in the second layer, wherein a bottom of the trench is the first layer, the trench having a first sidewall and a second sidewall opposite the first sidewall;
    forming a first gate dielectric layer along the first sidewall, the second sidewall and the bottom of the trench;
    forming a semiconductor channel layer over the first gate dielectric layer in the trench;
    forming a second gate dielectric layer over the semiconductor channel layer in the trench, wherein the second gate dielectric layer physically contacts the first gate dielectric layer;
    removing at least a portion of the first layer and the second layer to expose an exposed portion of the second gate dielectric layer and the first gate dielectric layer around a channel region of the semiconductor channel layer; and
    forming a gate electrode around the exposed portion of the second gate dielectric layer and the first gate dielectric layer, wherein the gate electrode is interposed between a first portion of the semiconductor channel layer and a second portion of the semiconductor channel layer along a plane parallel to a major surface of the substrate.

10. The method of claim 9, wherein removing at least a portion of the first layer and the second layer comprises removing a first portion of the first layer and a first portion of the second layer, wherein after removing the first portion of the first layer and the first portion of the second layer, second portions of the first layer and second portions of the second layer remains along opposing ends of the first gate dielectric layer, wherein after forming the gate electrode, the gate electrode is interposed between the second portions of the first layer and between the second portions of the second layer.

11. The method of claim 9, wherein forming the first gate dielectric layer comprises:
   forming a first gate dielectric material layer along the first sidewall of the trench, the second sidewall of the trench, the bottom of the trench, and an upper surface of the second layer; and
   removing the first gate dielectric material layer from the upper surface of the second layer.

12. The method of claim 11, wherein forming the second gate dielectric layer comprises:
   forming a second gate dielectric material layer over the semiconductor channel layer and the upper surface of the second layer; and
   removing the second gate dielectric material layer from the upper surface of the second layer.

13. The method of claim 12, wherein, after removing the second gate dielectric material layer from the upper surface of the second layer, the second gate dielectric layer extends higher than the upper surface of the second layer.

14. The method of claim 9, wherein the first gate dielectric layer has a thickness in a range of 1 nm to 2 nm.

15. The method of claim 9, wherein the semiconductor channel layer has a thickness in a range of 1 nm to 100 nm.

16. A method of forming a semiconductor device, the method comprising:
   forming a first layer over a substrate;
   forming a second layer over the first layer;
   forming a trench in the second layer, wherein a bottom of the trench comprises the first layer, the trench having a first plane and a second plane, the first plane being along a longitudinal axis and the second plane being perpendicular to the longitudinal axis, the trench having a first sidewall and a second sidewall opposite the first sidewall along the second plane;
   forming a first gate dielectric material layer along the first sidewall, along the second sidewall, along the bottom of the trench, and over an upper surface of the second layer;
   forming a semiconductor material layer over the first gate dielectric material layer;
   removing the first gate dielectric material layer and the semiconductor material layer from over the upper surface of the second layer;
   after removing the first gate dielectric material layer and the semiconductor material layer from over the upper surface of the second layer, forming a second gate dielectric material layer over remaining portions of the semiconductor material layer and the first gate dielectric material layer, wherein the second gate dielectric material layer physically contacts the first gate dielectric material layer;
   removing the second gate dielectric material layer over the upper surface of the second layer;
   removing the first layer and the second layer from under remaining portions of the first gate dielectric material layer and from along sidewalls of the first gate dielectric material layer in the second plane; and
   forming a gate electrode around the second gate dielectric material layer and the first gate dielectric material layer in the second plane, wherein the gate electrode is interposed between a first portion of the semiconductor material layer and a second portion of the semiconductor material layer along a plane parallel to a major surface of the substrate.

17. The method of claim 16, wherein the substrate comprises a semiconductor substrate and a dielectric layer over the semiconductor substrate.

18. The method of claim 16, wherein the second gate dielectric material layer extends higher than the second layer after removing the second gate dielectric material layer over the upper surface of the second layer.

19. The method of claim 16, wherein, after removing the first layer and the second layer from under the remaining portions of the first gate dielectric material layer and from along sidewalls of the first gate dielectric material layer, at least a portion of the first layer and the second layer remains in the first plane.

20. The method of claim 19, wherein, after removing the first layer and the second layer from under the remaining portions of the first gate dielectric material layer and from along sidewalls of the first gate dielectric material layer, an upper surface of the first gate dielectric material layer and an upper surface of the semiconductor material layer is level with an upper surface of the portion of the second layer that remains in the first plane.

* * * * *